(12) United States Patent
Jeong et al.

(10) Patent No.: US 8,390,776 B2
(45) Date of Patent: Mar. 5, 2013

(54) THIN FILM TRANSISTOR ARRAY AND METHOD OF MANUFACTURING THE SAME

(75) Inventors: Ki-Hun Jeong, Cheonan-si (KR); Seung-Hwan Shim, Seongnam-si (KR); Joo-Han Kim, Yongin-si (KR); Hong-Kee Chin, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/450,643

(22) Filed: Apr. 19, 2012

(65) Prior Publication Data

US 2012/0208330 A1 Aug. 16, 2012

Related U.S. Application Data

(62) Division of application No. 12/498,526, filed on Jul. 7, 2009, now Pat. No. 8,184,251.

(30) Foreign Application Priority Data

Jul. 7, 2008 (KR) ........................ 10-2008-0065492

(51) Int. Cl.
*G02F 1/13* (2006.01)

(52) U.S. Cl. ............................ 349/187; 349/43; 349/138

(58) Field of Classification Search .................. 349/187, 349/43, 138, 110, 38; 257/59, E27.111, E21.536; 438/149, 155

See application file for complete search history.

(56) References Cited

U.S. PATENT DOCUMENTS

| | | | |
|---|---|---|---|
| 6,506,617 B1 | 1/2003 | Cheng | |
| 6,586,286 B2 | 7/2003 | Park et al. | |
| 6,624,864 B1 * | 9/2003 | Kubo et al. | ............ 349/139 |
| 7,279,370 B2 * | 10/2007 | Lim et al. | ............ 438/155 |
| 2007/0248905 A1 | 10/2007 | Ohta et al. | |

FOREIGN PATENT DOCUMENTS

| | | |
|---|---|---|
| JP | 10239678 | 9/1998 |
| JP | 10305369 | 11/1998 |
| KR | 100135024 | 1/1998 |

* cited by examiner

*Primary Examiner* — Thoi Duong
(74) *Attorney, Agent, or Firm* — Cantor Colburn LLP

(57) ABSTRACT

A method of manufacturing a thin film transistor array substrate includes: forming a gate pattern on a substrate; forming a first gate insulating film and a second gate insulating film on the substrate; forming a source/drain pattern and a semiconductor pattern on the substrate; forming a passivation film on the substrate; forming a photo-resist pattern on the passivation film; patterning the passivation film using the photo-resist pattern to form a passivation film pattern, the patterning of the passivation film including over-etching the passivation film to form an open region in the passivation film; forming a transparent electrode film on the substrate; removing the photo-resist pattern and a portion of the transparent electrode film on the photo-resist pattern; and forming a pixel electrode on the first gate insulating layer.

10 Claims, 7 Drawing Sheets

US 8,390,776 B2

THIN FILM TRANSISTOR ARRAY AND METHOD OF MANUFACTURING THE SAME

CROSS REFERENCE TO RELATED APPLICATIONS

This application is a divisional of U.S. patent application Ser. No. 12/498,526, filed on Jul. 7, 2009, which claims priority to Korean Patent Application No. 10-2008-0065492, filed on Jul. 7, 2008, and all the benefits accruing therefrom under 35 U.S.C. §119, the contents of which in its entirety are herein incorporated by reference.

BACKGROUND OF THE INVENTION

1. Field of the Invention

The present invention relates to a thin film transistor array, and more particularly, to method of manufacturing the thin film transistor array. Even more particularly, the present invention relates to a method of manufacturing a thin film transistor array substrate, the method having a reduced number of steps in a mask process thereof.

2. Description of the Related Art

In general, a liquid crystal display device displays an image by adjusting a transmittance of a liquid crystal material in liquid crystal cells with an electric field. The liquid crystal display device typically includes a liquid crystal display panel in which the liquid crystal cells are disposed, often in a substantially matrix pattern, and a driving circuit which drives the liquid crystal display panel.

The liquid crystal display panel typically includes a thin film transistor array substrate and a color filter array substrate facing disposed opposite to, e.g., facing, the thin film transistor array substrate, and a spacer which maintaining a cell gap between the thin film transistor array substrate and the color filter array substrate. The liquid crystal material is injected into the cell gap.

The thin film transistor array substrate generally includes gate lines, data lines, and switching devices, such as a thin film transistor, for example, disposed at crossing locations of the gate lines and the data lines on the thin film transistor array substrate. In addition, a pixel electrode, substantially defining each of the liquid crystal cells, is connected to each of the thin film transistors. Further, a first alignment film is disposed on the thin film transistor array substrate.

The gate lines and the data lines receive signals from the driving circuits via respective pad parts. Based on a scan signal supplied to a gate line, for example, the thin film transistor supplies the pixel electrode with a pixel voltage signal supplied to the data line from the driving circuits.

The color filter array substrate typically includes color filters disposed corresponding to each of the liquid crystal cells, a black matrix which reflects external light and separates the color filters, a common electrode which supplies a reference voltage to the liquid crystal cells, and a second alignment film.

The liquid crystal display panel is typically fabricated by combining the thin film transistor array substrate with the color filter array substrate which, is manufactured separately from the thin film transistor array substrate, injecting the liquid crystal material therebetween, and sealing thin film transistor array substrate and the color filter array substrate having the liquid crystal material therebetween.

In the liquid crystal display device, a thin film transistor array substrate fabrication involves, for example, a semiconductor formation process which requires a plurality of mask processes, complicating a manufacturing process of the liquid crystal display device. A number of the plurality of mask processes is a major factor contributing to manufacturing costs of the liquid crystal display panel. In attempts to reduce the manufacturing costs, a thin film transistor array substrate has been developed to include a reduced number of steps used in the mask processes. For example, one mask process may include a plurality of sub-processes, such as thin film deposition, cleaning, photolithography, etching, photo-resist stripping and inspection processes, for example. Recent development efforts have resulted in a four-round mask process which eliminates one mask process from an earlier, standard, five-round mask process.

Thus, the thin film transistor array substrate and the manufacturing method thereof of the prior art typically incorporates the four-round mask process. However, the four-round mask process is still a complex manufacturing process which limits reductions of the manufacturing cost. Hence, there is a need for further simplifying the manufacturing process and thereby further reducing the manufacturing cost of the liquid crystal display device.

BRIEF SUMMARY OF THE INVENTION

Exemplary embodiments of the present invention provide a method of manufacturing a thin film transistor array substrate which solves one or more of the abovementioned problems, limitations and/or disadvantages of the prior art.

An exemplary embodiment of the present invention provides a simplified thin film transistor array structure and manufacturing process thereof.

Another exemplary embodiment of the present invention reduces a number of mask processes required for manufacturing a thin film transistor array substrate.

In an exemplary embodiment of the present invention, a substrate for a display panel includes a base substrate, a gate line disposed in a first direction on the base substrate and including a gate electrode, a first gate insulating layer disposed on the gate line, a second gate insulating layer disposed on the first gate insulating layer, a semiconductor layer including a channel portion disposed on the second gate insulating layer, a data line disposed in a second direction, substantially perpendicular to the first direction, and including a source electrode and a drain electrode disposed opposite the source electrode, a passivation layer disposed on the gate line and the data line and including an openings through which a portion of the first gate insulating layer and a portion of the drain electrode are exposed, and a pixel electrode disposed on the first gate insulating layer in the opening and connected to the drain electrode.

A planar shape defined by the pixel electrode is substantially the same as a planar shape defined by the opening.

The substrate may further include a storage electrode, disposed in the second direction on the base substrate, and the storage electrode may be made of a substantially the same material as a material of the gate line. A width of the storage electrode, measured in the first direction, is greater than a corresponding width of the data line measured in the first direction.

In an exemplary embodiment of the present invention, the first gate insulating layer is made of silicon oxide and the second gate insulating layer is made of silicon nitride.

In an alternative exemplary embodiment of the present invention, a method of manufacturing a thin film transistor array includes forming a gate pattern on a substrate, forming a first gate insulating film on the substrate, forming a second gate insulating film on the substrate, forming a source/drain pattern and a semiconductor pattern on the substrate, forming a passivation film on the substrate, forming a photo-resist pattern on the passivation film, patterning the passivation film using the photo-resist pattern to form a passivation film pattern, the patterning the passivation film including over-etching the passivation film, forming a transparent electrode film on the substrate, removing the photo-resist pattern and a portion of the transparent electrode film disposed on the photo-resist pattern, and forming a pixel electrode on the first gate insulating layer.

A planar shape defined by the pixel electrode is substantially the same as a planar shape defined by the open region.

The thin film transistor array may include a data line, and the method may further include forming a storage electrode in a direction substantially parallel to the data line. The storage electrode includes a material substantially the same as a material of the gate pattern.

The first gate insulating film may include silicon oxide, and the second gate insulating film may include silicon nitride.

BRIEF DESCRIPTION OF THE DRAWINGS

The above and other aspects, advantages and features of the present invention will become more readily apparent by describing in further detail exemplary embodiments thereof with reference to the accompanying drawings, in which.

DETAILED DESCRIPTION OF THE INVENTION

Figure 1A:
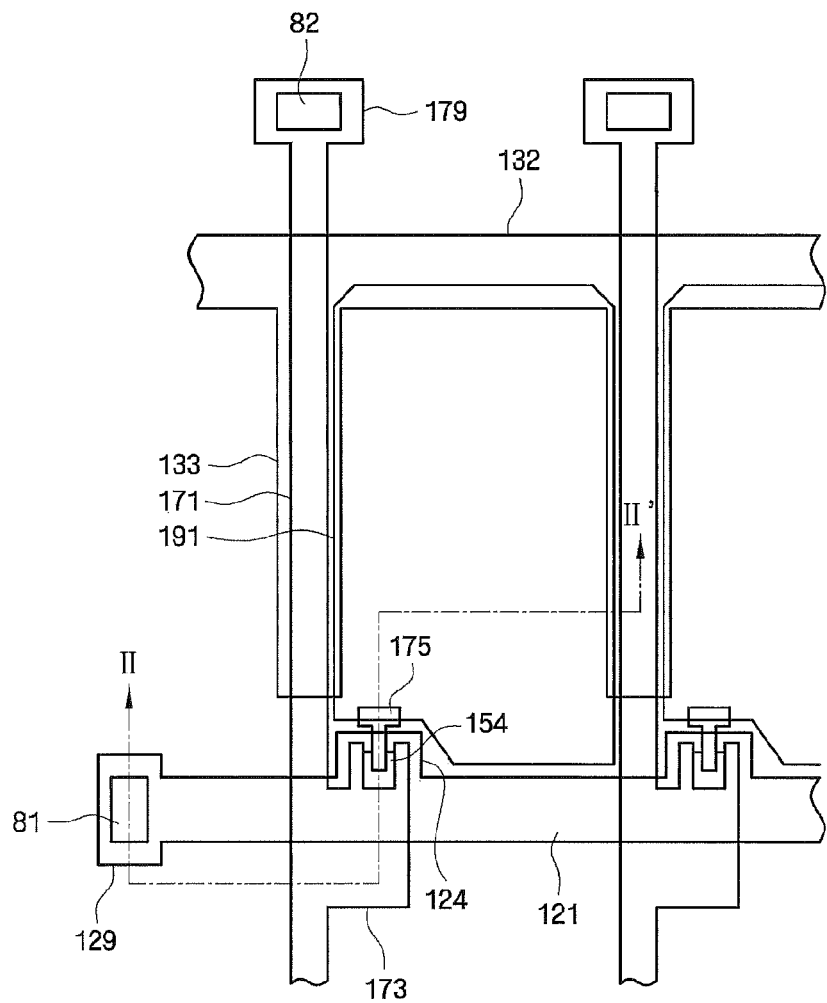
FIG. 1A is a plan view showing an exemplary embodiment of a thin film transistor array substrate according to the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to FIGS. 1A to 7E.

Figure 1B:
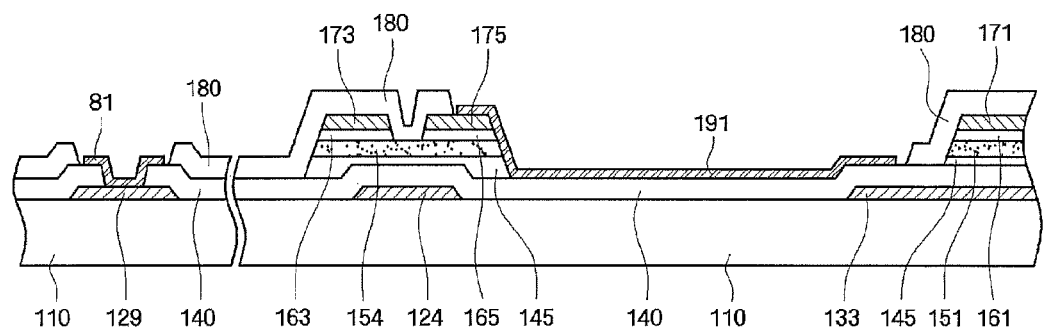
FIG. 1B is a partial cross-sectional view taken along line in FIG. 1A.

FIG. 1A is a plan view showing an exemplary embodiment of a thin film transistor array substrate according to the present invention, and FIG. 1B is a partial cross-sectional view taken along line in FIG. 1A.

Referring to FIGS. 1A and 1B, the thin film transistor array substrate according to an exemplary embodiment includes a gate line 121, a data line 171, a first gate insulating layer 140 and a second gate insulating layer 145 disposed on a lower substrate 110. In an exemplary embodiment, the first gate insulating layer 140 and the second gate insulating layer 145 are disposed between the gate line 121 and the data line 171, as shown in FIG. 1B. Gate lines 121 of a plurality of gate lines 121 and data lines 171 of a plurality of data lines 171 generally cross each other, e.g., are disposed substantially perpendicular to each other. In an exemplary embodiment, a thin film transistor is disposed at crossing points of the date lines 121 and the data lines 171, and a pixel electrode 191 is disposed in a cell region defined therein.

The thin film transistor includes a gate electrode 124 connected to the gate line 121, a source electrode 173 connected to the data line 171, a drain electrode 175 connected to the pixel electrode 191, and a semiconductor pattern including a first active layer 154 which overlaps the gate electrode 124 and the first gate insulating layer 140, as well as the second gate insulating layer 145, and which is disposed between the gate electrode 124 and the first active layer 154 to form a channel between the source electrode 173 and the drain electrode 175. The thin film transistor applies a pixel voltage signal supplied to the data line 171 to the pixel electrode 191 based on a gate signal supplied to the gate line 121. In an exemplary embodiment, the pixel electrode 191 maintains the voltage signal supplied to the pixel electrode 191 through the thin film transistor to display an image.

The semiconductor pattern includes the first active layer 154 overlapping the gate electrode 124, with the first gate insulating layer 140 and the second gate insulating layer 145 positioned therebetween. The first active layer 154 includes a channel portion disposed between the source electrode 173 and the drain electrode 175. The semiconductor pattern includes a second active layer 151 overlapping a storage electrode 133 extending from a storage electrode line 132. The semiconductor pattern according to an exemplary embodiment of the present invention may further include ohmic contact layers 161,163,165 disposed on the first active layer 154 and the second active layer 151. The ohmic contact layers 161,163,165 make ohmic contact with the data line 171, the source electrode 173 and the drain electrode 175, respectively, as shown in FIG. 1B.

In an exemplary embodiment, the pixel electrode 191 is connected to the drain electrode 175 of the thin film transistor, a portion of which is exposed through a passivation layer 180, e.g., a passivation film 180. The pixel electrode 191 may form a potential difference, e.g., a voltage difference, with a common electrode (not shown) disposed on an upper substrate (not shown) by accumulating charges based on the pixel voltage. As a result of the potential difference, liquid crystal molecules in the liquid crystal material disposed between the thin film transistor substrate and the upper substrate rotate due to a dielectric anisotropy property thereof. The rotation of the liquid crystal molecules aligns the liquid crystal molecules and a corresponding amount of light incident on the pixel electrode 191 from a light source (not shown) is thereby transmitted toward the upper substrate to display an image.

The pixel electrode 191 according to an exemplary embodiment has a substantially plane shape which corresponds to an open region formed by the passivation layer 180 in a pixel region during a lift-off process, described in greater detail below. More specifically, the pixel electrode 191 is formed by the lift-off process using a photoresist pattern which is formed in the passivation layer 180 forming process.

The thin film transistor according to an exemplary embodiment has a small height difference between a pixel electrode region of the thin film transistor and a storage electrode region thereof, due to a residual of the first gate insulating layer 140 disposed in pixel electrode region. Therefore, during an alignment layer (not shown) rubbing process, a rubbing defect caused, for example, by a larger height difference is substantially decreased and/or effectively minimized. Also, cell gap non-uniformity, due to the height difference of a spacer between a higher region spacer and a lower region spacer is substantially decreased.

The thin film transistor array substrate according to an exemplary embodiment of the present invention is formed using of a three-round mask process. Specifically, a method of manufacturing the thin film transistor array substrate according to an exemplary embodiment of the present invention using the three-round mask process includes a first mask process for forming the gate line 121, a second mask process for forming the semiconductor pattern, a source pattern 173 and a drain pattern 175, and a third mask process for forming the passivation film 180 and a pixel electrode pattern 191.

FIGS. 2 to 7E are plan views and partial cross-sectional views sequentially illustrating an exemplary embodiment of a method of manufacturing a thin film transistor array substrate according to the present invention.

Figure 2:
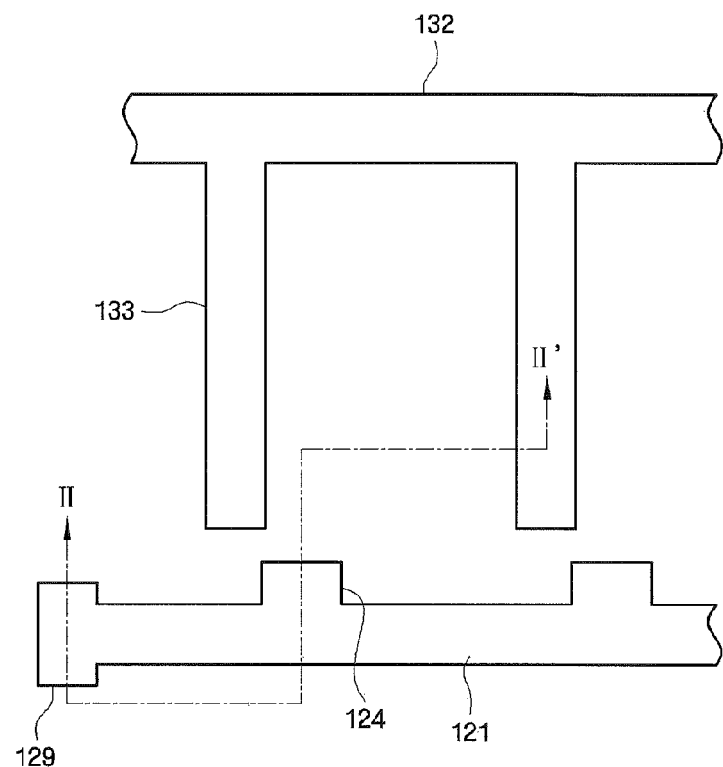
FIGS. 2, 4 and 6 are plan views sequentially illustrating an exemplary embodiment of method of manufacturing a thin film transistor array substrate according to the present invention.
Figure 3:
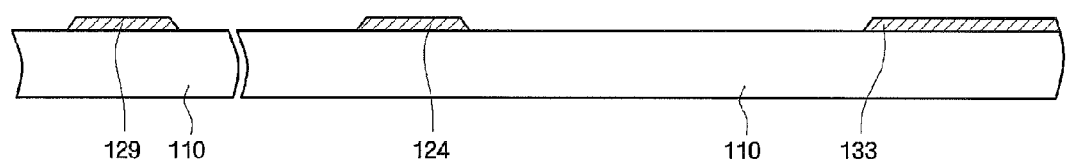
FIGS. 3, 5A-5D and 7A-7E are partial cross-sectional views sequentially illustrating an exemplary embodiment of method of manufacturing a thin film transistor array substrate according to the present invention.
Figure 4:
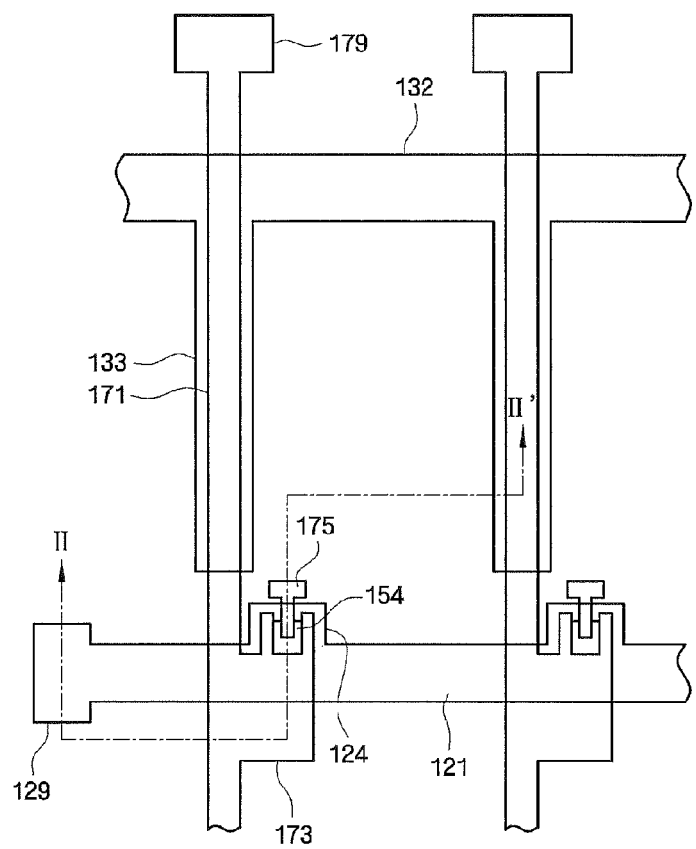

FIGS. 2 and 3 are a plan view and a partial cross-sectional view, respectively, illustrating gate patterns formed on the lower substrate 110 by the first mask process according to an exemplary embodiment of a method of manufacturing the thin film transistor array substrate according to the present invention.

Referring to FIGS. 1A, 1B, 2 and 3, a gate metal layer (not fully shown) is formed on the lower substrate 110 by a deposition method, such as a sputtering method, for example. Next, the gate metal layer is patterned by a photolithography process, for example, using a first mask and an etching process, to form gate patterns including the gate line 121, the gate electrode 124, a first end of the gate line 129, and the storage electrode 133. In an exemplary embodiment, the gate metal layer may include a material such as chromium (Cr), molybdenum-tungsten ("MoW"), chromium-aluminum ("Cr/Al"), copper ("Cu", aluminum-neodymium ("Al(Nd)"), molybdenum-aluminum ("Mo/Al"), molybdenum-aluminum-neodymium ("Mo/Al(Nd)") and/or chromium-aluminum-neodymium ("Cr/Al(Nd)"), for example. In addition, the gate metal layer according to an exemplary embodiment may include a single layer or, alternatively, a double layer structure having one or more of the above-mentioned materials.

FIGS. 4 and 5A-5D are a plan view and partial cross-sectional views, respectively, of the substrate including the source pattern 173, the drain pattern 175 and the semiconductor pattern formed by the second mask process in an exemplary embodiment of a method of manufacturing the thin film transistor array substrate according to the present invention.

Referring to FIGS. 1A, 2A, 4 and 5A, the first gate insulating layer 140, the second gate insulating layer 145, an amorphous silicon layer 150, a n+ amorphous silicon ohmic contact layer 160, and a data metal layer 170 are formed on the lower substrate 110 having the gate patterns thereon by a deposition technique such as plasma enhanced chemical vapor deposition ("PECVD") or sputtering, for example. More specifically, in an exemplary embodiment of the present invention the first gate insulating layer 140 and/or the second gate insulating layer 145 include double layers having a high etch selectivity. For example, the first gate insulating layer 140 according to an exemplary embodiment may include an inorganic insulation material such as silicon oxide ("SiOx") and the second gate insulating layer 145 may include an inorganic insulation material such as silicon nitride ("SiNx"), but alternative exemplary embodiments are not limited thereto. The data metal layer 170 may include molybdenum (Mo), titanium (Ti), tantalum (Ta) or molybdenum alloy, for example.

Figure 5A:
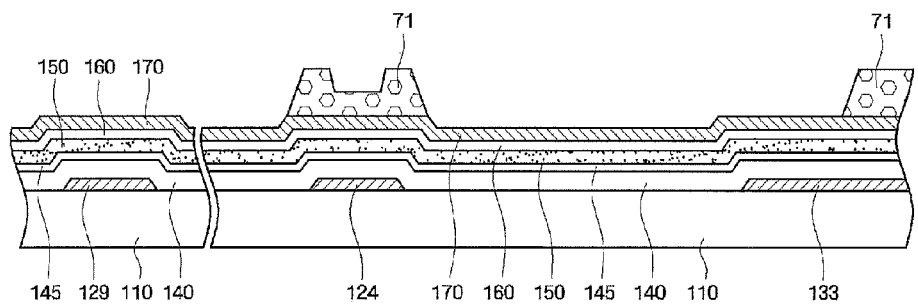

A photo-resist pattern 71 is formed on the data metal layer 170 by a photolithography process, for example, using a second mask and an etching process, as shown in FIG. 5A. In an exemplary embodiment, a diffractive exposure mask having a diffractive exposing part corresponding to a channel portion of the thin film transistor may be used as a second mask, thereby allowing the photo-resist pattern 71 at the channel portion to have a lower height than a height of the photo-resist pattern 71 at the source pattern 173 and the drain patter 175 (best shown in FIG. 5D).

Figure 5B:
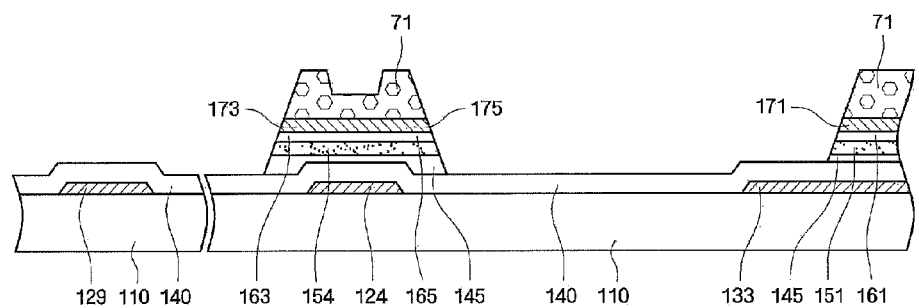

As shown in FIG. 5B, the data metal layer 170 is patterned by a wet etching process, for example, using the photo-resist pattern 71 to provide source/drain patterns including the data line 171, the source electrode 173 and the drain electrode 175. At this point, the source electrode 173 is integral to, e.g., is connected to, the source electrode 173 and a first end of the data line 179, as shown in FIG. 5B.

Using the photo-resist pattern 71, the amorphous silicon layer 150, the n+ amorphous silicon layer 160 and the second gate insulation layer 145 are patterned in a single dry etching process, for example, thereby forming the ohmic contact layers 161,163,165, the first active layer 154 and the second active layer 151, as well as the second gate insulating layer 145. In an exemplary embodiment of the present invention, only a portion of the first gate insulating layer 140 and the second gate insulating layer 145 is patterned in the second mask process.

Figure 5C:
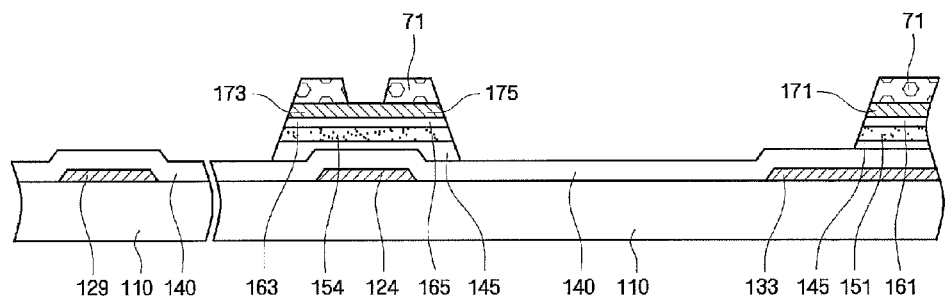
Figure 5D:
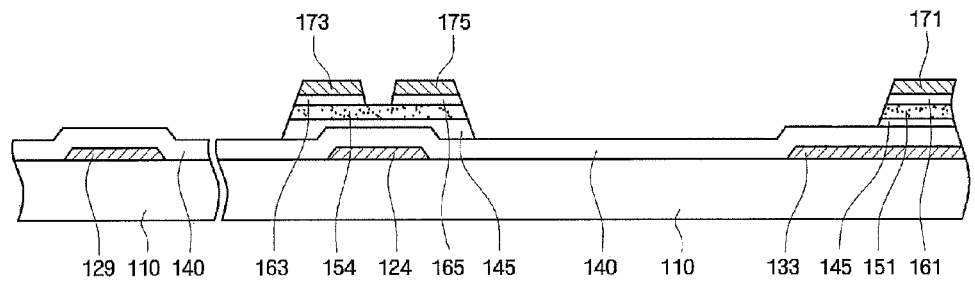
Figure 6:
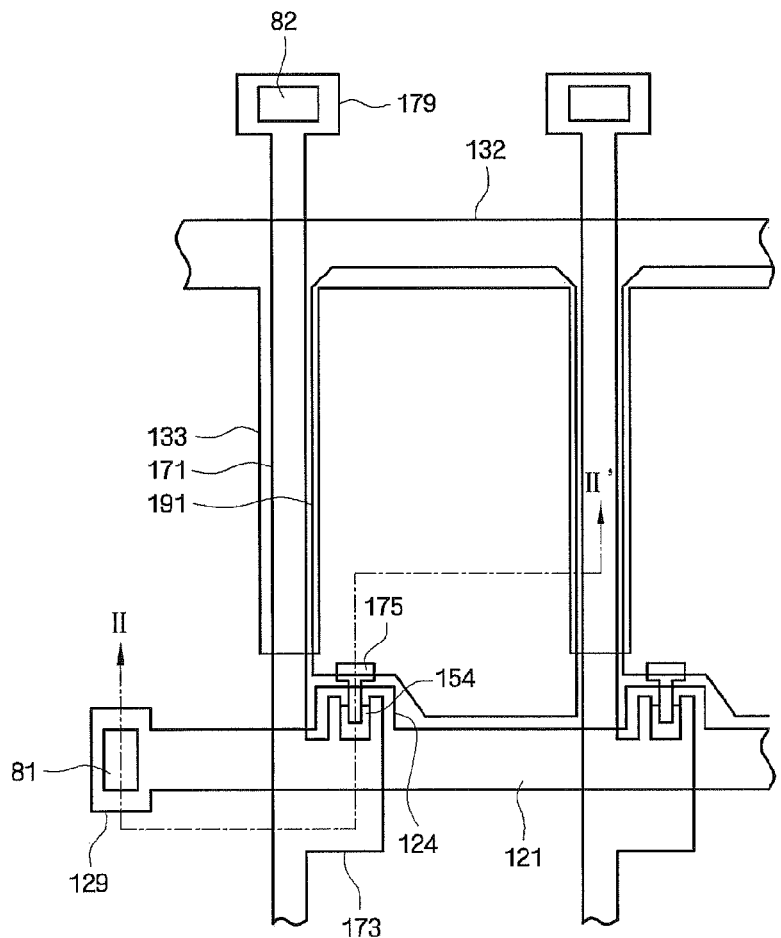

Next, as shown in FIG. 5C, the photo-resist pattern 71, having a relatively low height at the channel portion, is removed by an ashing process, for example. Thereafter, the source/drain pattern and the ohmic contact layers 163 and 165 of the channel portion are etched by a dry etching process, for example. Accordingly, the first active layer 154 of the channel portion is exposed and the source electrode 173 is separated from the drain electrode 175, as shown in FIG. 5D.

Thereafter, a remainder of the photo-resist pattern 71 left on the source/drain pattern part may be removed using a process, such as a stripping process, for example.

FIGS. 6 and 7A to 7E are plan views and partial cross-sectional views, respectively, of the substrate formed by the third mask process in the exemplary embodiment of the method of manufacturing the thin film transistor array substrate according to the present invention.

Figure 7A:
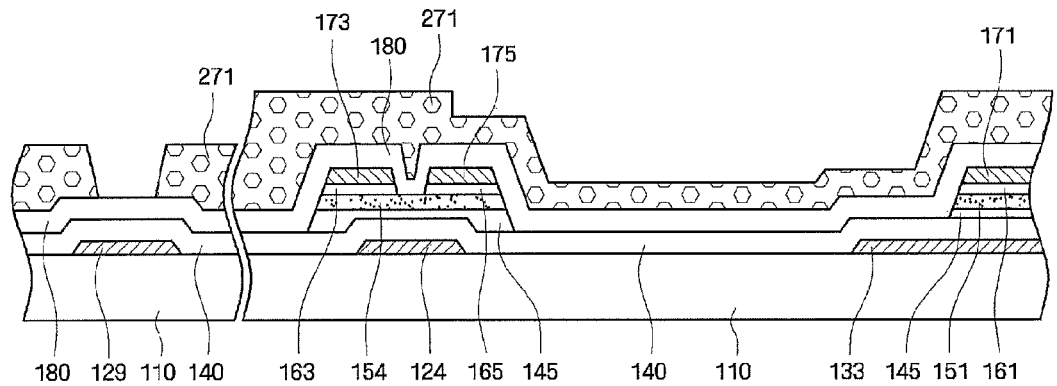

The passivation film 180, which may include an inorganic insulating material such as silicon oxide ("SiOx") and/or silicon nitride ("SiNx"), for example, or, alternatively, an organic insulating material having a small dielectric constant, such as an acrylic organic compound, benzocyclobutene ("BCB"), or perfluorocyclobutane ("PFCB"), for example, may be deposited, by a deposition technique such as a plasma enhanced chemical vapor deposition ("PECVD") technique, for example, on the first gate insulating layer 140 and the second gate insulating layer 145 having the source/drain patterns disposed thereon. In addition, a photo-resist may be disposed on the passivation film 180. Subsequently, a photo-resist pattern 271 is formed by a photolithography process, for example, using a third mask, as shown in FIG. 7A.

Subsequently, the passivation film 180 is patterned by dry-etching, for example, using the photo-resist pattern 271 as a mask. At this point, the gate insulating layer 140 and the passivation layer 180 on an upper portion of the first end of the gate line 129 may be etched.

Figure 7B:
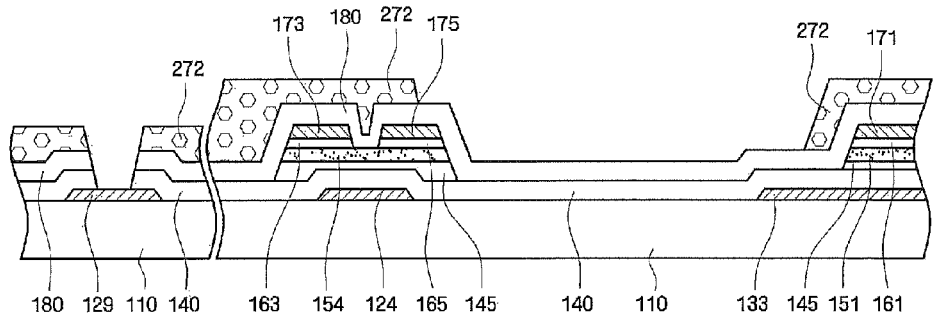

Referring now to FIG. 7B, a photo-resist pattern 272 which exposes a portion of an upper side of the drain electrode 175, a periphery of the first end of the data line 179, and an area in which the pixel electrode 191 will be formed is patterned by an etch-back process over a surface of the photo-resist pattern 272. The etch-back process over the surface of the photo-resist pattern 272 is performed using a dry ashing technique, for example, using oxygen ("$O_2$") plasma, but alternative exemplary embodiments are not limited thereto. The passivation film 180 is then patterned by a dry-etching, for example, using the photo-resist pattern 272 as a mask, thereby patterning the passivation layer 180 at an area except for the area where a transparent electrode pattern will be formed, as shown in FIG. 7C.

Figure 7C:
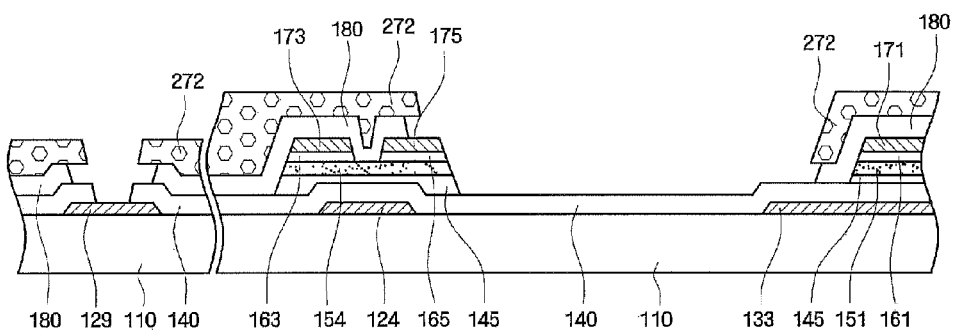

Referring to FIG. 7C, the passivation layer 180 is over-etched to form an undercut profile beneath the photo-resist pattern 272 above the drain electrode 175. In an exemplary embodiment of the present invention, an etching gas which includes a mixture of sulfur hexa fluoride ("$SF_6$") and oxygen ("$O_2$") is employed. In addition, when pressure is raised, a number of collisions, over a given time, between gas molecules increases and, therefore, a mean free path becomes shorter. As a result, a straight trajectory of the gas molecules is substantially decreased and thus irregular movement (e.g., left and right, as well as upward and downward) of the gas molecules increases. Accordingly, a lateral surface of the passivation film 180 formed beneath the photo-resist pattern 272 undergoes much more influence, e.g., etching, by the increased number of gas molecules moving left, right, upward and downward. Thus, the passivation film 180 disposed beneath the photo-resist pattern 272 becomes over-etched, as shown in FIG. 7C. Thus, the pixel electrode 191 can be more easily formed using a lift-off method, due to the over-etched profile of the passivation film 180 beneath the photo-resist pattern 272 according to an exemplary embodiment of the present invention.

Figure 7D:
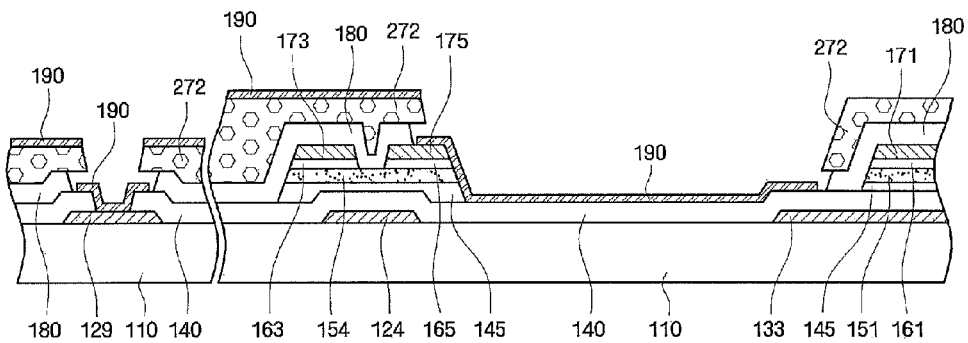
Figure 7E:
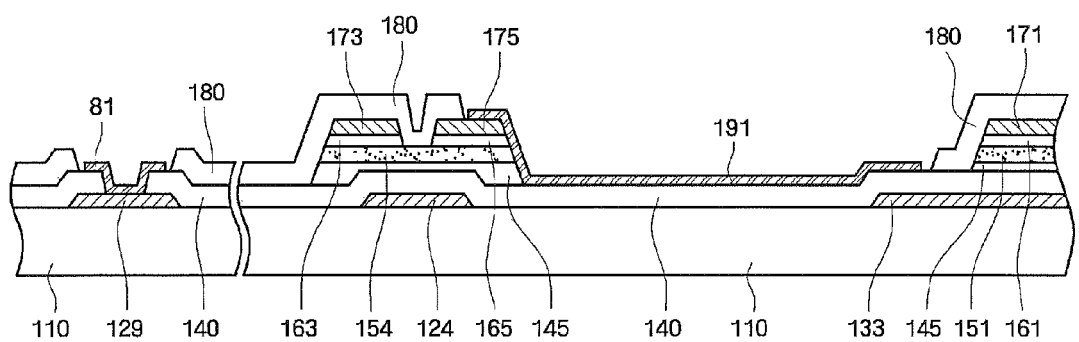

Referring now to FIG. 7D and FIG. 7E, a transparent electrode material 190 is deposited on the lower substrate 110 by a deposition method, such as a sputtering method, for example, on the lower substrate 110 having the remainder of the photo-resist pattern 272 disposed thereon. In an exemplary embodiment, the transparent electrode material 190 may include indium-tin-oxide ("ITO"), tin-oxide ("TO") or indium-zinc-oxide ("IZO"), for example.

The photo-resist pattern 272 is then removed by a stripping process using a lift-off method on the thin film transistor array substrate on which the transparent electrode material 190 is deposited. The transparent electrode material 190 deposited on the photo-resist pattern 272 is then removed, together with the photo-resist pattern 272, as shown in FIG. 7E, to form a transparent pattern including an upper gate pad electrode 81, the pixel electrode 191, and an upper data pad electrode 82.

According to exemplary embodiments of the present invention as described herein, a method of manufacturing a thin film transistor array substrate according to the present invention provides advantages which include, but are not limited to, a substantially simplified configuration of the substrate and manufacturing process thereof which include a three-round mask using a lift-off method. As result, manufacturing costs of the substrate are substantially decreased while a manufacturing yield thereof is substantially increased.

In addition, in an exemplary embodiment of the present invention, a portion of the first gate insulating layer 140 and/or the second gate insulating layer 145 which remains below a pixel electrode 191 results in a substantially reduced error rate caused by sharp differences of height therebetween.

The present invention should not be construed as being limited to the exemplary embodiments set forth herein. Rather, these exemplary embodiments are provided so that this disclosure will be thorough and complete and will fully convey the concept of the present invention to those skilled in the art.

Although the present invention has been particularly shown and described with reference to exemplary embodiments thereof, it will be understood by those of ordinary skill in the art that various changes or modifications in form and details may be made therein without departing from the spirit or scope of the present invention as defined by the following claims.

What is claimed is:

1. A method of manufacturing a thin film transistor array, the method comprising:
   forming a gate pattern on a substrate;
   forming a first gate insulating film on a pixel region of the substrate;
   forming a second gate insulating film on the substrate;
   forming a source/drain pattern and a semiconductor pattern on the substrate;
   forming a passivation film on the substrate;
   forming a photo-resist pattern on the passivation film;
   patterning the passivation film using the photo-resist pattern to form a passivation film pattern, the patterning of the passivation film comprising over-etching the passivation film to form an open region in the passivation film defining an undercut profile beneath the photo-resist pattern above the drain electrode;
   forming a transparent electrode film on the substrate;
   removing the photo-resist pattern and a portion of the transparent electrode film disposed thereon; and
   forming a pixel electrode directly on the first gate insulating layer.

2. The method according to claim 1, wherein a planar shape defined by the pixel electrode is substantially the same as a planar shape defined by the open region.

3. The method according to claim 2, wherein the thin film transistor array comprises a data line, the method further comprising forming a storage electrode in a direction substantially parallel to the data line, wherein the storage electrode includes a substantially same material as the gate pattern.

4. The method according to claim 3, wherein
   the first gate insulating film comprises silicon oxide, and
   the second gate insulating film comprises silicon nitride.

5. The method according to claim 2, wherein
   the first gate insulating film comprises silicon oxide, and
   the second gate insulating film comprises silicon nitride.

6. The method according to claim 1, wherein the thin film transistor array comprises a data line, the method further comprising forming a storage electrode in a direction substantially parallel to the data line, wherein the storage electrode includes a substantially same material as the gate pattern.

7. The method according to claim 6, wherein
   the first gate insulating pattern comprises silicon oxide, and
   the second gate insulating pattern comprises silicon nitride.

8. The method according to claim 1, wherein
   the first gate insulating layer pattern comprises silicon oxide, and
   the second gate insulating pattern comprises silicon nitride.

9. The method according to claim 1, wherein forming the pixel electrode directly on the first gate insulating layer includes using a lift-off method.

10. The method according to claim 1, wherein forming the pixel electrode directly on the first gate insulating layer includes removing the transparent electrode film together with the photo-resist pattern.

* * * * *